United States Patent
Mazen et al.

(10) Patent No.: US 6,946,369 B2
(45) Date of Patent: Sep. 20, 2005

(54) METHOD FOR FORMING, BY CVD, NANOSTRUCTURES OF SEMI-CONDUCTOR MATERIAL OF HOMOGENOUS AND CONTROLLED SIZE ON DIELECTRIC MATERIAL

(75) Inventors: Frédéric Mazen, Grenoble (FR); Thierry Baron, Grenoble (FR); Jean-Michel Hartmann, Meylan (FR); Marie-Noelle Semeria, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 50 days.

(21) Appl. No.: 10/718,109

(22) Filed: Nov. 19, 2003

(65) Prior Publication Data

US 2004/0147098 A1 Jul. 29, 2004

(30) Foreign Application Priority Data

Nov. 22, 2002 (FR) ............................. 02 14658

(51) Int. Cl.[7] .............................. H01L 21/20
(52) U.S. Cl. .................... 438/478; 438/749; 438/967
(58) Field of Search ................. 438/478, 479, 438/967

(56) References Cited

U.S. PATENT DOCUMENTS

| | | | |
|---|---|---|---|
| 5,250,452 A | 10/1993 | Ozturk et al. | |
| 6,724,017 B2 * | 4/2004 | Semeria et al. | ............. 257/183 |
| 2003/0186512 A1 | 10/2003 | Semeria et al. | |
| 2004/0005723 A1 * | 1/2004 | Empedocles et al. | .......... 438/1 |

OTHER PUBLICATIONS

Copy of French Search Report, corresponding to French patient application FR 0214658.
Madhukar, et al CVD growth of Si nanocrystals on dieletric surfaces for nanocrystal floating gate memory application, Mat. REs. Soc. Symp. Proc. vol. 638 © 2001 Material Research Society.
Fernandes et al, Memory Characteristics of Si Quantum Dot Devices with $SiO_2$/ALD $AL_2O_3$ Tunneling Dielectrics.
Mazen et al, A two Steps CVD process for the growth of Silicon nano–crystals, Applied Surface Science 214 (2003) 359–363.
Schmidt et al, Self–Assembled Ge/Si Dots for Faster Field–Effect Transistors, IEEE Transactions on Electron Devices, vol. 48, No. 6,6–01.
Kamins et al., Lithographic positioning of self–assembled Ge islands on Si(001) ©1997 American Institute for Physics.
Baron et al, Silicon quantum fot nucleation on $Si_3N_4SiO_2$ and $SiO_xN_y$ substrates for nanoelectronic devices, Journal of Crystal Growth 209 (200) 1004–1008.
Ishii et al, Selective Ge deposition on Si using thermal decomposition of $GeH_4$, © 1985 AMerican Institute of Physics.

* cited by examiner

Primary Examiner—David Nelms
Assistant Examiner—Quoc Hoang
(74) Attorney, Agent, or Firm—Thelen Reid & Priest, LLP

(57) ABSTRACT

The invention concerns a method for forming nanostructures of semi-conductor material on a substrate of dielectric material by chemical vapour deposition (CVD). Said method comprises the following steps:

a step of forming on the substrate (12) stable nuclei (14) of a first semi-conductor material in the form of islands, by CVD from a precursor (11) of the first semi-conductor material chosen so that the dielectric material (12) accepts the formation of said nuclei (14), a step of forming nanostructures (16A, 16B) of a second semi-conductor material from the stable nuclei (14) of the first semi-conductor material, by CVD from a precursor (21) chosen to generate a selective deposition of the second semi-conductor material only on said nuclei (14).

The invention further concerns nanostructures formed according to one of said methods as well as devices comprising said nanostructures.

23 Claims, 1 Drawing Sheet

METHOD FOR FORMING, BY CVD, NANOSTRUCTURES OF SEMI-CONDUCTOR MATERIAL OF HOMOGENOUS AND CONTROLLED SIZE ON DIELECTRIC MATERIAL

CROSS-REFERENCE TO RELATED APPLICATION

This application claims priority to French application no. 02 14658, filed on Nov. 22, 2002, entitled: "A Method For Forming, by CVD, Nanostructures of Semi-Conductor Material of Homogenous and Controlled Size on Dielectric Material" and was not published in English.

TECHNICAL FIELD

The invention concerns a method for forming nanostructures of semi-conductor material on a dielectric material by chemical vapour deposition (CVD), said nanostructures being of homogeneous and controlled size. The semi-conductor material is, in particular, silicon or germanium.

The invention further concerns devices with nanostructures obtained by means of the method according to the invention.

The nanostructures formed in this way are intended for forming electronic, optic or opto-electronic devices and, in particular, for forming Coulomb blockade devices that use quantum dots.

The applications targeted in particular by the present invention are granular gate storage cells and DOTFET, which are field effect transistors that use nanostructures.

STATE OF THE PRIOR ART

The constant improvement in the performance of microelectronic circuits requires an increasingly higher integration rate of their elementary component, the MOSFET. Until now, the microelectronics industry has always been able to reduce the dimensions of the MOSFET by optimising the technological methods and has done so without encountering any major physical limitations in its operation. However, in the short or medium term, the SIA Roadmap provides for a gate length of around 35 nm, beyond which quantum effects will disrupt its correct operation. Solutions therefore need to be developed to replace the CMOS technology.

One of the most promising routes involves using the charge retention/Coulomb blockade properties of semi-conductor nanostructures. A considerable amount of research is therefore being carried out at present to integrate said nanostructures, mainly formed of silicon, into said devices.

For these specific applications, the nanostructures must be electrically isolated from the substrate by a dielectric layer. They must also be spatially isolated, in other words that they must not be in contact with each other. Furthermore, the size and the density of the nanostructures must be controlled with precision: their dimension must be less than 10 nm and their spatial density on the substrate must be high, in other words vary between $10^9$ and some $10^{12}$ nanostructures/$cm^2$.

Several methods exist for forming said nanostructures such as, for example, chemical vapour deposition (CVD), which in particular allows the deposition on dielectrics of crystals of silicon of nanometric dimensions (with a diameter less than 10 nm).

The method for forming a layer of silicon on a dielectric by CVD from precursors such as silane or disilane is of the Volmer-Webber type: islands having three dimensions are first formed which grow up to the point of coalescence, before forming a continuous layer. By stopping the growth of the islands during the first stages of the deposition, one obtains crystalline islands of nanometric dimensions. However, with said method, the nucleation and growth phases are simultaneous. Consequently, when one applies the precursor gas 1 onto the dielectric 2 (FIGS. 1A and 1B), the first stable nuclei 4 formed grow while new nuclei 5 appear (FIG. 1B). One thus obtains in the end a dielectric having nanostructures of varied sizes 6A and 6B (FIG. 1C), where the size of the silicon nanocrystals obtained can be less than 10 nm. (It should be noted that in the case represented by FIGS. 1A to 1C, it involves a composite substrate comprising a substrate 3 covered with a layer of dielectric material 2).

With said method, the silicon nanocrystals are also isolated from each other. Moreover, according to the document [1] referenced at the end of the present description, the spatial densities of the nanostructures obtained by CVD vary from $10^9$ to some $10^{12}/cm^2$ depending on the deposition conditions and the chemical nature of the substrate.

The main limitation of this technique is the high dispersion in size, around 50%, of the silicon nanocrystals.

This has the effect of limiting the quality and the performance of devices based on said structures.

In the same way, nanostructures of germanium may also be integrated into devices. In certain cases, the difference in the physical properties between silicon and germanium may make germanium more interesting for the applications targeted by the invention. Indeed, germanium has a narrower forbidden band than that of silicon, which allows a better confinement of the charges and an easier charging of the nanostructures.

However, the deposition of nanostructures of germanium on dielectric by CVD is not mentioned in the literature. Indeed, the most commonly used precursor of germanium in CVD, germane, does not lead to deposition on silica. In this respect, it is known that germanium grows selectively on silicon compared to silica by CVD from germane (see the document [2] referenced at the end of the present description).

The deposition of germanium by CVD on silica has however been studied, but in a different context to that of the present invention. According to the document [3] referenced at the end of the present description, it involved replacing poly-silicon in the gates of MOS transistors by poly-germanium. In this respect, the germanium structures formed were continuous layers of poly-germanium, several tens of nanometres thick. In order to deposit the layers of poly-germanium on silicon by CVD of germane, it has been proposed depositing beforehand a continuous layer of poly-silicon several nanometres thick on which could be grown the continuous layer of poly-germanium by CVD of germane.

DESCRIPTION OF THE INVENTION

The invention proposes a method for forming nanostructures of semi-conductor material on a substrate of dielectric material by chemical vapour deposition (CVD) that does not have the disadvantages of the prior art.

The method according to the invention comprises the following steps:

a step of forming on the substrate stable nuclei of a first semi-conductor material in the form of islands by CVD from a precursor of the first semi-conductor material, chosen so that the dielectric material accepts the formation of said nuclei, a step of forming nanostructures of a second semi-conductor material from the stable nuclei of the first semi-conductor material, by CVD from a precursor chosen to generate a selective deposition of the second semi-conductor material only on said nuclei.

In other words, the precursor of the second material is chosen from among the precursors that make it possible to generate a selective deposition on the nucleus formed during the first CVD step, instead of on the dielectric substrate.

According to a first embodiment, the first and second semi-conductor materials are in silicon.

According to a second embodiment, the first semi-conductor material is in silicon and the second semi-conductor material is in germanium.

In other words, the method according to the invention makes it possible, firstly, to deposit nanostructures of germanium isolated from each other on a dielectric material by CVD; if the substrate of dielectric material is in silica and one uses germane as precursor of germanium, one does not need, thanks to said method, to deposit an intermediate continuous layer of silicon on the substrate of dielectric material of silica. By said method, the nanostructures have a homogeneous and controlled size, and their density varies between $10^9$ and some $10^{12}/cm^2$. Advantageously, by playing on the temperature and pressure parameters of the precursor during the deposition, one can obtain either crystalline or amorphous nanostructures.

Furthermore, the invention also makes it possible to deposit, on a dielectric material, nanostructures of silicon isolated from each other by CVD with less size dispersion than that taught by the prior art.

Preferentially, the substrate of dielectric material is chosen in such a way that it is as reactive as possible with the precursor of the first semi-conductor material.

According to a first embodiment, said substrate of dielectric material is chosen from among the group comprising $SiO_2$, $SiO_2$ with a high density of Si—OH groups on its surface, $Si_3N_4$, $Al_2O_3$ and $HfO_2$.

Advantageously, the step of forming stable nuclei of a first semi-conductor material is carried out for an exposure time chosen as a function of the desired density of nuclei; the longer the exposure time, the higher the density of nuclei.

The step of forming nanostructures of a second semi-conductor material from stable nuclei of the first semi-conductor material is, for its part, carried out for an exposure time advantageously chosen as a function of the desired size of nanostructures; the longer the exposure time, the larger the size of the nanostructures.

Advantageously, the CVD steps are carried out with a low partial pressure of precursor. Indeed, if the partial pressure of the precursors is low, the rate of growth of the nuclei is low and one can thus control more easily the size of the nanostructures.

According to a specific embodiment of the invention, the precursor of the first semi-conductor material is silane.

In this case, the formation of nuclei of the first semi-conductor material is carried out at a temperature between 550° C. and 700° C. and with a low partial pressure of silane, less than around 133 Pa (1 Torr). The deposition temperature interval is chosen in such a way that the temperature is sufficiently high for the precursor to be able to dissociate and generate the formation of a crystalline nucleus, and also as low as possible in order to limit the rate of growth of said nuclei.

According to a specific embodiment in which the step of forming stable nuclei of a first semi-conductor material is carried out at partial pressures less than around 1.33 Pa (10 mTorr), the exposure time of the substrate to the precursor of the first semi-conductor material is less than 15 minutes.

In another specific embodiment in which the step of forming stable nuclei of the first semi-conductor material is carried out at partial pressures less than around 133 Pa (1 Torr), the exposure time of the substrate to the precursor of the first semi-conductor material is less than 1 minute.

Advantageously, when the first and second semi-conductor materials deposited on said substrate, in one case, and on said nuclei, in the other case, are silicon, the precursor of the second semi-conductor material is dichlorosilane.

Advantageously, when the first semi-conductor material deposited on said substrate is silicon and the second semi-conductor material deposited on said nuclei is germanium, the precursor of the second semi-conductor material is germane.

Consequently, when the precursor of the second semi-conductor material is dichlorosilane or germane, the step of forming nanostructures is carried out at a temperature between 300° C. and 1000° C. and with a partial pressure of the precursor less than around 133 Pa (1 Torr).

The invention further concerns nanostructures formed by one of the methods according to the invention, characterised in that the nanostructures are of homogeneous and controlled size.

According to a specific embodiment, said nanostructures may be doped by co-deposition or by implantation with elements such as boron, phosphorous, arsenic or erbium.

Said nanostructures formed by one of the methods according to the invention may be encapsulated by deposition of a dielectric.

The invention further concerns devices having nanostructures obtained by means of one of the methods according to the invention.

According to a specific embodiment, said device may be a storage cell having a floating gate which is composed of nanostructures formed by means of one of the methods according to the invention.

Advantageously, said storage cell is a DOTFET.

The invention has numerous other advantages.

Firstly, since the range of spatial densities of the nanostructures obtained with said method is identical to that of the nuclei deposited in the first CVD step, the size of the nanostructures obtained in the end may be chosen over a wide range of values where the minimum size of the nanostructures is around one nanometre and the maximum size is that beyond which said nanostructures begin to touch each other. Consequently, one may control the density of said nanostructures over a wide range between $10^9$ and some $10^{12}/cm^2$.

Furthermore, due to the separation of the germination and growth steps, the size distribution of the nanostructures obtained by said method is very narrow.

It should be noted that, in the case of germanium nanostructures, the purity of the nanostructures obtained is high since the size of the nuclei formed during the first CVD step is small compared to that of the final nanostructures.

Thanks to said method, the average size of the silicon nanostructures may be controlled with precision and may be modified easily without having to change the deposition conditions: it is sufficient to modify the deposition time of the second step in order to have nanostructures of the desired size. On the other hand, in the case of a method in a single step, a modification of the deposition time would lead to a modification of the average size of the nanostructures, but also of their density. Consequently, it would be necessary to modify the deposition conditions, pressure and temperature in order to obtain the desired density of silicon nanostructures.

BRIEF DESCRIPTION OF THE DRAWINGS

The invention will be more fully understood and other advantages and specific features will become clearer on reading the description that follows, given by way of illustration and in nowise limitative, and by referring to the appended drawings, among which.

DETAILED DESCRIPTION OF SPECIFIC EMBODIMENTS

Figure 1:
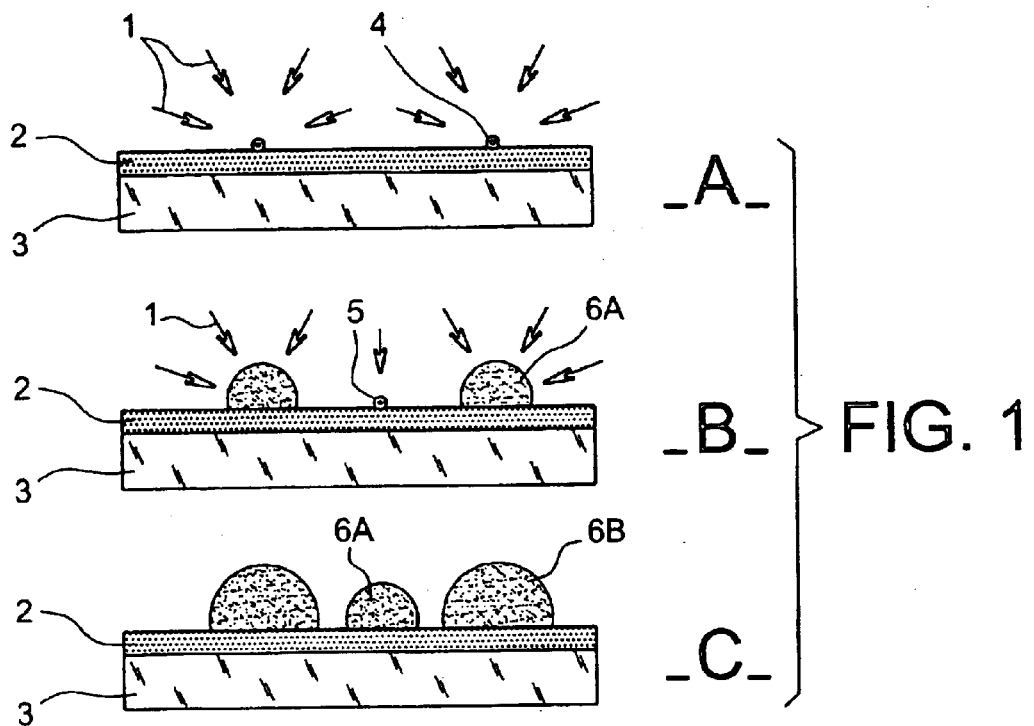
FIGS. 1A to 1C, already described, illustrate the method for growing silicon nanostructures by CVD in a single step according to the prior art.
Figure 2:
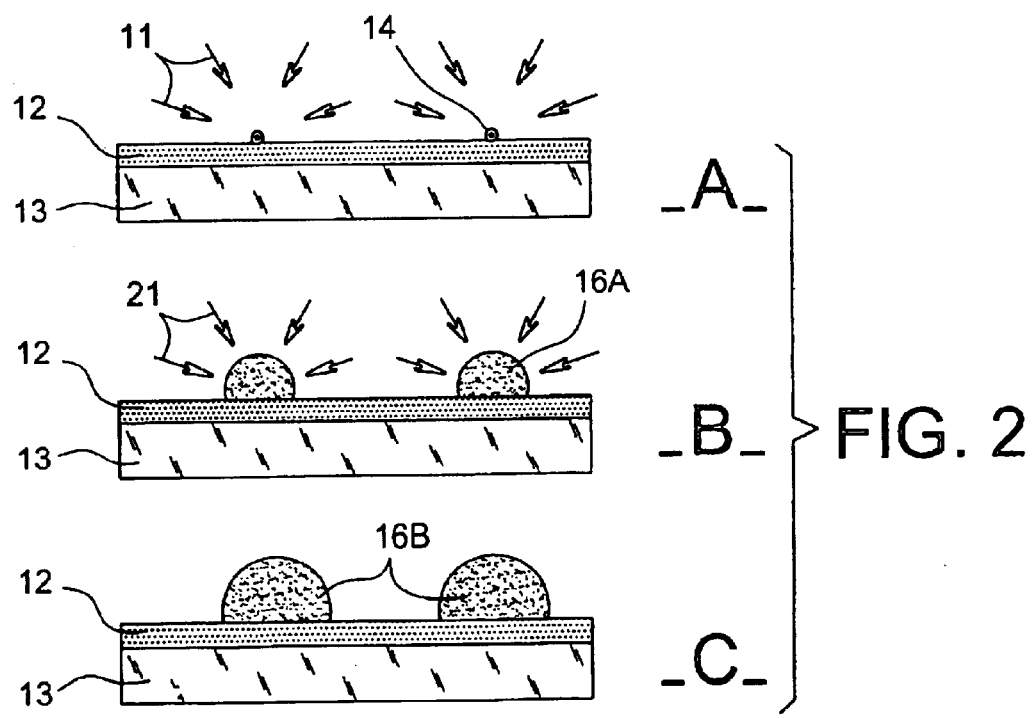
FIGS. 2A to 2C illustrate the method for growing silicon or germanium nanostructures by CVD in two steps, according to the invention.

FIG. 2A illustrates what happens during the first CVD step: one applies to the substrate 13 covered with a dielectric layer 12 a precursor gas 11, which allows the formation of nuclei 14 on the dielectric 12. This is the nucleation phase.

Then, in the second CVD step (FIG. 2B), one applies a precursor gas 21 of the nanostructures 16A that one wishes to obtain, in other words nanostructures of germanium or silicon depending on the case, and these selectively grow on the nuclei 14 formed during the first step, instead of on the dielectric substrate 12. This is the growth phase.

After the two CVD steps, one obtains a device with nanostructures of homogeneous size 16B (FIG. 2C).

We will now focus on the detailed description of the method for forming germanium nanostructures on a silica dielectric substrate according to the invention. We have seen previously that said method comprises two CVD steps:

the first step where stable silicon nuclei are deposited on the dielectric substrate (FIG. 2A),
the second step where germanium nanostructures selectively grow on the nuclei formed during the first step instead of on the dielectric substrate (FIG. 2B).

The aim of the first step is to functionalise in a discrete manner the surface of the dielectric silica substrate in order to allow the growth of germanium nanostructures.

The silicon nuclei, where the terms "nucleus" signifies a cluster of several tens to several thousands of atoms, are always very small in relation to the size of the final germanium nanostructures.

We have seen in the introduction that in order to use the charge retention/Coulomb blockade properties of the semiconductor nanostructures, it is necessary for the density of the nuclei to be between $10^9$ and some $10^{12}/cm^2$. Moreover, the distance between the nuclei must be greater than the desired diameter of the germanium nanostructures so that said nanostructures do not coalesce.

To summarise, the experimental conditions must be such that a high density of stable nuclei form, spread out uniformly on the substrate and in such a way that the formation of the nuclei is as instantaneous as possible, so that the nuclei all have the same size.

In order to satisfy all of these criteria, the operating conditions must be perfectly controlled.

Firstly, the exposure of the surface must be carried out at sufficiently high temperature so that the precursor of silicon can dissociate and generate the formation of a crystalline nucleus. However, the deposition temperature must also be chosen as low as possible in order to limit the rate of growth of said nuclei. For example, in the case of silane as precursor of silicon, the formation of silicon nuclei is advantageously carried out at a temperature between 550° C. and 700° C.

The partial pressure of the precursor of silicon must be low so that the rate of growth of the nuclei is low. In the case of silane as precursor of silicon, the partial pressure of silane is preferentially below around 133 Pa (1 Torr). The precursor may be diluted in a vector gas or not.

The deposition time is chosen as a function of the desired density of nuclei. In the case of an exposure of the dielectric substrate to silane at partial pressures below around 1.33 Pa (10 mTorr), the exposure time of the surface to the gas is less than 15 minutes.

In the case of silane use at partial pressures less than around 133 Pa (1 Torr), the exposure time of the surface to the gas is less than 1 minute.

In order to obtain high densities of nuclei, the dielectric substrate must be as reactive as possible with the precursor of silicon, in order to favour the formation of nuclei rather than the diffusion of the precursor to the surface. In the case of an exposure of the dielectric substrate to silane, high densities of nuclei are formed on $Si_3N_4$, $Al_2O_3$, $HfO_2$ or $SiO_2$ having a high density of Si—OH groups at its surface.

The spatial density of the nuclei formed during said first step determines the final density of germanium nanostructures. The density of the nuclei may be controlled by the surface chemical properties of the substrate and the arrangement of said nuclei may be controlled according to the method described in the document [4] referenced at the end of this description.

During the second CVD step, the germanium nanostructures grow selectively on the nuclei formed during the first step instead of on the dielectric substrate. The precursor of germanium is preferentially germane, but could also be another precursor in so far as it generates a selective deposition on the nucleus formed during the first CVD step instead of on the dielectric.

The growth of the germanium nanostructures is carried out under conventional conditions for depositing germanium on silicon by CVD: the temperature must be between 300° C. and 1000° C., the partial pressure of the precursor of germanium must be less than around 133 Pa (1 Torr) and the deposition time must be determined in such a way as to obtain nanostructures of the desired size.

The size of the nanostructures is controlled by the deposition conditions (pressure, temperature and time) of said second CVD step. Preferably, one uses operating conditions so that the rate of growth of the nanostructures is low, in order to be able to control with precision the size of said nanostructures. Consequently, one uses a low partial pressure of the precursor of germanium and a low deposition temperature but which allows its dissociation to the surface of the substrate.

The method according to the invention also makes it possible to form silicon nanostructures in which the size dispersion is much narrower compared to the method described in the literature by deposition of silane in a single step [1]. In order to achieve this, the silicon nucleus is formed during the first CVD step as described here-above (FIG. 2A) and one uses, for the second CVD step; a precursor of silicon that makes it possible to generate a selective deposition on the nucleus of silicon created instead of on the dielectric substrate (FIG. 2B). One may, for example, use dichlorosilane as precursor of silicon. In this case, the deposition of silicon from dichlorosilane may be carried out at temperatures varying between 300° C. and 1000° C., and with partial pressures of precursor less than around 133 Pa (1 Torr).

Under these conditions, the invention makes it possible to eliminate one of the principal causes of the size dispersion of the silicon nanostructures obtained by CVD in a single step. This cause, which is intrinsic to said method of formation in one deposition step, is that the nucleation and growth phases are simultaneous. Indeed, in the case of depositing silicon nanocrystals on dielectric, it has been measured that the average size and the density of said nanocrystals continuously and simultaneously increases up to coalescence (see document [5] at the end of this description). The invention makes it possible to dissociate said nucleation and growth steps leading to the formation of silicon nanostructures by CVD. This results in a much narrower size dispersion of the nanostructures obtained compared to the method in a single CVD step described in the literature. For example, whereas the silicon nanostructures formed by CVD from silane in a single step have a size dispersion of 50% [1], the silicon nanocrystals formed according to the two step deposition method described above, using silane in the first CVD step and dichlorosilane in the second CVD step, have a size dispersion less than 20%.

Said silicon or germanium nanostructures may be doped by co-deposition or by implantation with elements such as boron, phosphorous, arsenic, erbium in order to, for example, improve their luminescence or retention properties.

Said nanostructures may also be encapsulated by deposition of a dielectric. For example, said nanostructures encapsulated in this way may be used for a storage application, where the charge in the form of electrons reaches the nanostructures, which here are storage points, through a thin dielectric film. In the same way, said encapsulated nanostructures may be used for a reading application.

We will now describe in more detail two embodiments of a device according to the invention.

The first example illustrates the formation of germanium nanostructures on a silicon substrate having a thin dielectric film in the form of silica. The base substrate is silicon <100> of resistivity between 7 and 10 Ω.m and doped p. One carries out an oxidation of said substrate at 800° C. in an oven: a layer of oxide 7 nm thick is formed in this way.

During the first CVD step, silicon nuclei are deposited from $SiH_4$ precursor at 600° C. at a partial pressure of around 8 Pa (60 mTorr) and for a period of 15 s. The silicon nuclei obtained have a size less than 1 nm and cannot be detected by high resolution scanning microscopy.

During the second step, silicium nanostructures are deposited by CVD from $GeH_4$ precursor at 600° C. at a partial pressure of around 1.20 Pa (9 mTorr) and for a period of 15 s. One obtains germanium nanocrystals of 15 nm average diameter, with a size dispersion less than 20%. Their density is $5.10^9$ nanocrystals/cm$^2$ and the quantity of silicon in the germanium nanostructure is so low that it cannot be detected by techniques such as XPS.

The second example, for its part, illustrates the formation of silicon nanostructures on a silicon substrate with a thin dielectric layer in the form of silica. The base substrate is silicon <100> of resistivity between 7 and 10 Ω.m and doped p. One carries out an oxidation of said substrate at 800° C. in an oven: a layer of oxide 7 nm thick is formed in this way.

During the first step, silicon nanostructures are deposited by CVD from $SiH_4$ precursor at 600° C. at a partial pressure of around 8 Pa (60 mTorr) and for a period of 15 s. The silicon nuclei obtained have a size less than 1 nm and cannot be detected by high resolution scanning microscopy.

During the second step, silicium nanostructures are deposited by CVD from $SiH_2Cl_2$ precursor at 650° C. at a partial pressure of around 8 Pa (60 mTorr) and for a period of 300 s. One obtains silicon nanocrystals of 5 nm average diameter, with a size dispersion less than 20%. The density is $5.10^9$ nanocrystals/cm$^2$.

BIBLIOGRAPHY

[1] T. BARON, F. MARTIN, P. MUR, C. WYON, Journal of Crystal Growth, 209, 1004–1008 (2000).
[2] H. ISHII, Y. TAKAHASHI, J. MUROTA, Applied Physics Letter, 47, 863–865 (1985).
[3] OZTURK, MEHMET, WORTMAN, JIMMIE, U.S. Pat. No. 5,250,452.
[4] M. N. SEMERIA, P. MUR, F. MARTIN, F. FOURNEL, H. MORICEAU, J. EYMERY, N. MAGNEA, T. BARON, patent application FR-A-2 815 026.
[5] S. MADHUKAR, K. SMITH, R. MURALIDHAR, D. O'MERAR, M. SADD, B-Y NGUYEN, B. WHITE, B. JONES, Material Research Society Symposium proceedings 638, F 5.2.1 (2001).

What is claimed is:

1. A method for forming nanostructures of semi-conductor material on a substrate of dielectric material by chemical vapour deposition (CVD), comprising characterised in that it comprises the following steps:
   forming a stable nuclei on the substrate of a first semi-conductor material in the form of islands, by CVD from a precursor of the first semi-conductor material chosen so that the dielectric material accepts the formation of said nuclei,
   forming nanostructures of a second semi-conductor material from the stable nuclei of the first semi-conductor material, by CVD from a precursor chosen to generate a selective deposition of the second semi-conductor material only on said nuclei.

2. A method according to claim 1 in which the first and second semi-conductor materials are silicon.

3. A method according to claim 2 in which the precursor of the first semi-conductor material is silane.

4. A method according to claim 3 wherein forming the stable nuclei of the first semi-conductor material is carried out at a temperature between about 550° C. and 700° C. and with a low partial pressure of silane, less than around 133 Pa (1 Torr).

5. A method according to claim 3 in which the step of forming stable nuclei of a first semi-conductor material being carried out at partial pressures less than around 1.33 Pa (10 mTorr), the exposure time of the substrate to the precursor of the first semi-conductor material is less than 15 minutes.

6. A method according to claim 3 wherein forming a stable nuclei of the first semi-conductor material being carried out at partial pressures less than around 133 Pa (1 Torr), the exposure time of the substrate to the precursor of the first semi-conductor material is less than 1 minute.

7. A method according to claim 2 in which the precursor of the second semi-conductor material is dichlorosilane.

8. A method according to claim 7 in which the step of forming nanostructures is carried out at a temperature between about 300° C. and 1000° C. and with a partial pressure of precursor less than around 133 Pa (1 Torr).

9. A method according to claim 1 in which the first semi-conductor material is silicon and the second semi-conductor material is germanium.

10. A method according to claim 9 in which the precursor of the second semi-conductor material is germane.

11. A method according to claim 1 in which the substrate of dielectric material is chosen in such a way that it is as reactive as possible with the precursor of the first semi-conductor material.

12. A method according to claim 1 wherein the substrate of dielectric material comprises an $SiO_2$ group, the $SiO_2$ group having a high density of Si—OH groups on its surface.

13. A method according to claim 1 wherein forming a stable nuclei of a first semi-conductor material is carried out for an exposure time chosen as a function of a desired density of a nuclei.

14. A method according to claim 1 wherein forming nanostructures of a second semi-conductor material is carried out for an exposure time chosen as a function of a desired size of the nanostructures.

15. A method according to claim 1 wherein the precurser of the first semi-conductor material and the precurser of the second semi-conductor material have a low partial pressure.

16. A method according to claim 1 wherein the formed nanostructures are homogeneous and a controlled size.

17. A method according to claim 16 further comprising doping the formed nanostructures with a co-deposition.

18. A method according to claim 16 further comprising encapsulating the formed nanostructures with a deposition of a dielectric.

19. A storage cell having a floating gate characterised in that said floating gate is formed of nanostructures according to claim 18.

20. A storage cell according to claim 19 characterised in that it is a DOTFET.

21. A method according to claim 18 further comprising forming a floating gate from the formed nanostructures, wherein the floating gate is coupled to a storage cell.

22. A method according to claim 21 wherein the storage cell is a DOTFET.

23. A method according to claim 16 further comprising doping the formed nanostructures by implantation with elements selected from the group consisting of boron, phosphorous, arsenic and erbium.

* * * * *